(12) United States Patent
Lei

(10) Patent No.: US 11,764,116 B2
(45) Date of Patent: Sep. 19, 2023

(54) METHOD AND STRUCTURE FOR DETECTING PHYSICAL SHORT-CIRCUIT DEFECT BETWEEN FIRST METAL LAYER AND GATE BELOW

(71) Applicant: SHANGHAI HUALI INTEGRATED CIRCUIT CORPORATION, Shanghai (CN)

(72) Inventor: Shuhua Lei, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 322 days.

(21) Appl. No.: 17/358,633

(22) Filed: Jun. 25, 2021

(65) Prior Publication Data
US 2021/0407871 A1    Dec. 30, 2021

(30) Foreign Application Priority Data

Jun. 30, 2020 (CN) .......................... 202010611967.9

(51) Int. Cl.
*H01L 23/58*     (2006.01)
*H01L 21/66*     (2006.01)
*G01R 31/28*     (2006.01)

(52) U.S. Cl.
CPC .......... *H01L 22/32* (2013.01); *G01R 31/2812* (2013.01); *H01L 22/14* (2013.01); *H01L 23/58* (2013.01)

(58) Field of Classification Search
None
See application file for complete search history.

(56) References Cited

U.S. PATENT DOCUMENTS

| | | | | |
|---|---|---|---|---|
| 11,430,733 B2* | 8/2022 | Ho | ........................ | H01L 29/401 |
| 2001/0035525 A1* | 11/2001 | Kikuchi | .................. | H01L 22/32 |
| | | | | 438/18 |
| 2002/0187582 A1* | 12/2002 | Satya | .................... | H01L 23/544 |
| | | | | 257/E23.179 |
| 2011/0036981 A1* | 2/2011 | Zhao | ..................... | H01J 37/226 |
| | | | | 250/306 |
| 2020/0335407 A1* | 10/2020 | Baek | ....................... | H01L 22/30 |

* cited by examiner

*Primary Examiner* — Benjamin P Sandvik
(74) *Attorney, Agent, or Firm* — Alston & Bird LLP

(57) ABSTRACT

A method for detecting a physical short-circuit defect between the first metal layer and a gate below. A first detection structure and a second detection structure are arranged in parallel in a detection region or a dicing channel region on a wafer, each detection structure comprises a P-type active detection, a detection gate structure, a contact hole in the P-type active detection, gate contact holes at two ends of the detection gate structure, a metal wire connected to the contact hole in the P-type active detection, and a metal wire connected to the gate contact hole. The detection gate structure of the first detection structure and the metal wire above it at least partially overlap. However, there is no projective overlap region between the detection gate structure of the second detection structure and the metal wire above it.

15 Claims, 5 Drawing Sheets

METHOD AND STRUCTURE FOR DETECTING PHYSICAL SHORT-CIRCUIT DEFECT BETWEEN FIRST METAL LAYER AND GATE BELOW

CROSS-REFERENCES TO RELATED APPLICATIONS

This application claims priority to Chinese patent application No. CN 202010611967.9, filed on Jun. 30, 2020, and entitled "METHOD AND STRUCTURE FOR DETECTING PHYSICAL SHORT-CIRCUIT DEFECT BETWEEN FIRST METAL LAYER AND GATE BELOW IT", the disclosure of which is incorporated herein by reference in entirety.

TECHNICAL FIELD

The present application relates to semiconductor integrated circuit manufacturing technologies, in particular to a defect detection technology.

BACKGROUND

In the manufacturing process of semiconductor chips, defect detection is an indispensable and critical step. A defect is found by means of defect detection, and the time from defect occurrence to finding it has been significantly shortened, thereby has improved the yield of semiconductor chips and reduced the production cost. In addition, with the downward trending of the technology nodes, the molding requirements of devices has become higher, and defect detection has become increasingly important.

In the manufacturing process of semiconductor chips, defects may occur in any process steps. In the existing art, defect detection is usually performed after each process step. However, single-step detection cannot reflect the defect problems caused by interaction between various process steps. For example, the current art mainly relies on thickness measurement of a single layer for monitoring a short-circuit defect between a first metal layer and a gate below. The method has significant limitations and cannot fully reflect the defect problem caused by interaction between various layers, for example, fluctuations in the CMP process may result in an excessively thin interlayer dielectric layer and relatively deep over-etching of the first metal layer; since the single-layer process is outlying but does not exceed the specification limits, passing is usually performed normally, but the combination of the two processes may lead to a physical contact between the first metal layer and the gate below, causing a short-circuit, that is, a physical short-circuit defect occurs. Moreover, the defect between upper and lower layers is difficult to find by means of direct defect comparison scanning methods, and the problem is usually found in the final yield test. In addition, it is also difficult to find the cause, resulting in extra time for finding the defect and a relatively large yield loss.

Semiconductor integrated circuits are typically formed on wafers. With the development of technologies, the diameter sizes, of wafers have increased from 4 inches, to 6 inches, to 8 inches and to 12 inches. The edges of the wafers are often the areas where defects are more likely to occur. As the wafer size increases, edges of the wafers are more prone to defects. For example, the thickness of the interlayer dielectric layer of chips on the edges of the wafers can be significantly affected by fluctuations in some processes such as the chemical mechanical planarization (CMP). Therefore, defect detection on the edge of the wafer is particularly important.

BRIEF SUMMARY OF THE DISCLOSURE

According to some embodiments in this application, a method for detecting a physical short-circuit defect between a first metal layer and a gate below is disclosed in the following steps: S1: providing a wafer, wherein the wafer comprises a plurality of lithography exposure units, each exposure unit comprises a plurality of dies, the plurality of dies are separated from each other by a dicing channel, a first P-type active region and a second P-type active region are formed in a detection region or a dicing channel region of the wafer, and the first P-type active region and the second P-type active region are arranged in parallel; S2: forming a first detection gate structure in the first P-type active region, and forming a second detection gate structure in the second P-type active region, wherein two ends of the first detection gate structure extend to the outside of the first P-type active region, a portion of the first detection gate structure that extends to the outside of the first P-type active region forms a connection region of the first detection gate structure, two ends of the second detection gate structure extend to the outside of the second P-type active region, and a portion of the second detection gate structure that extends to the outside of the second P-type active region forms a connection region of the second detection gate structure; S3: forming an interlayer dielectric layer, and performing a planarization process; S4: forming contact holes in the interlayer dielectric layer, wherein the contact holes comprise a first contact hole in the first P-type active region, a second contact hole in the second P-type active region, a first gate contact hole in the connection region of the first detection gate structure, and a second gate contact hole in the connection region of the second detection gate structure, and a distance between the first contact hole and the first detection gate structure adjacent thereto is equal to a distance between the second contact hole and the second detection gate structure adjacent thereto; S5: forming a first metal layer on the interlayer dielectric layer, the first metal layer comprising a first metal wire connected to the first contact hole, a second metal wire connected to the second contact hole, a third metal wire connected to the first gate contact hole, and a fourth metal wire connected to the second gate contact hole, and performing a planarization process, wherein the first metal wire and the first detection gate structure—below at least partially overlap, there is no projective overlap region between the second metal wire and the second detection gate structure below, the first P-type active region, the first detection gate structure, the first contact hole, the first gate contact hole, the first metal wire, and the third metal wire form a first detection structure, the second P-type active region, the second detection gate structure, the second contact hole, the second gate contact hole, the second metal wire, and the fourth metal wire form a second detection structure, and the first detection structure and the second detection structure are arranged in parallel to form a detection structure; and S6: performing defect detection by using a scanning electron microscope, wherein a voltage contrast of the scanning electron microscope is adjusted, images corresponding to the first metal wire and the second metal wire are adjusted to a bright contrast, the detection structure is imaged to obtain voltage contrast images of the first metal layer in the first detection structure and the second detection structure, and if only the metal wire connected to the contact hole in the connection region of the gate structure in the first detection structure has a brighter contrast, it is determined that there is a physical short-circuit defect between the first metal layer in the first detection structure and a gate below.

According to some embodiments in this application, a structure for detecting a physical short-circuit defect between a first metal layer and a gate below is disclosed, the structure comprising: a first P-type active region and a second P-type active region in an n-well in a detection region or a dicing channel region of a wafer, wherein the first P-type active region and the second P-type active region are arranged in parallel; a first detection gate structure and a first contact hole in the first P-type active region, wherein two ends of the first detection gate structure extend to the outside of the first P-type active region, and a portion of the first detection gate structure that extends to the outside of the first P-type active region forms a connection region of the first detection gate structure; a second detection gate structure and a second contact hole in the second P-type active region, wherein two ends of the second detection gate structure extend to the outside of the second P-type active region, and a portion of the second detection gate structure that extends to the outside of the second P-type active region forms a connection region of the second detection gate structure; a first gate contact hole and a second gate contact hole, wherein the first gate contact hole is located in the connection region of the first detection gate structure, and the second gate contact hole is located in the connection region of the second detection gate structure; an interlayer dielectric layer filling a region between the first detection gate structure, the second detection gate structure, the first contact hole, the second contact hole, the first gate contact hole, and the second gate contact hole; and a first metal wire, a second metal wire, a third metal wire, and a fourth metal wire formed on the interlayer dielectric layer, wherein the first metal wire is connected to the first contact hole, the second metal wire is connected to the second contact hole, the third metal wire is connected to the first gate contact hole, the fourth metal wire is connected to the second gate contact hole, the first metal wire and the first detection gate structure at least partially overlap, there is no projective overlap region between the second metal wire and the second detection gate structure, and a distance between the first contact hole and the first detection gate structure adjacent thereto is equal to a distance between the second contact hole and the second detection gate structure adjacent thereto.

Figure 1:
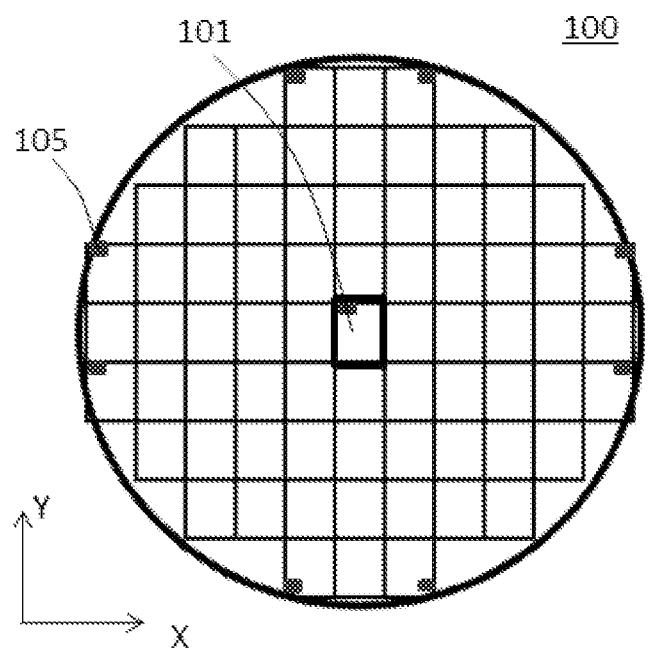
FIG. 1 is a schematic diagram of a wafer according to an embodiment.

Reference numerals of the main components in the drawings are explained as follows:

100, wafer; 110, first P-type active region; 120, second P-type active region; 112, first contact hole; 114, first metal wire; 111, first detection gate structure; 122, second contact hole; 124, second metal wire; 121, second detection gate structure; 130, interlayer dielectric layer, and 105, detection structure.

DETAILED DESCRIPTION OF THE DISCLOSURE

The embodiments in the present application will be clearly and completely described below with reference to the drawings. Obviously, the described embodiments are part of the embodiments of the present application, instead of all of them. Based on the embodiments in the present application, all other embodiments obtained by one skilled in the art without contributing any inventive labor shall fall into the protected scope of the present application.

One embodiment of the present application provides a method for detecting a physical short-circuit defect between a first metal layer and a gate below, the method includes steps of: S1: providing a wafer, wherein the wafer includes a plurality of photolithograph exposure units, each exposure unit includes a plurality of dies, the plurality of dies are separated from each other by dicing channels, a first P-type active region and a second P-type active region are formed in a detection region or a dicing channel region of the wafer, and the first P-type active region and the second P-type active region are arranged in parallel; S2: forming a first detection gate structure in the first P-type active region, and forming a second detection gate structure in the second P-type active region, wherein two ends of the first detection gate structure extend to the outside of the first P-type active region, a portion of the first detection gate structure that extends to the outside of the first P-type active region forms a connection region of the first detection gate structure, two ends of the second detection gate structure extend to the outside of the second P-type active region, and a portion of the second detection gate structure that extends to the outside of the second P-type active region forms a connection region of the second detection gate structure; S3: forming an interlayer dielectric layer, and performing a planarization process; S4: forming contact holes in the interlayer dielectric layer, wherein the contact holes include a first contact hole in the first P-type active region, a second contact hole in the second P-type active region, a first gate contact hole in the connection region of the first detection gate structure, and a second gate contact hole in the connection region of the second detection gate structure, and a distance between the first contact hole and the first detection gate structure adjacent thereto is equal to a distance between the second contact hole and the second detection gate structure adjacent thereto; S5: forming a first metal layer on the interlayer dielectric layer, the first metal layer including a first metal wire connected to the first contact hole, a second metal wire connected to the second contact hole, a third metal wire connected to the first gate contact hole, and a fourth metal wire connected to the second gate contact hole, and performing a planarization process, wherein the first metal wire and the first detection gate structure below at least partially overlap, there is no projective overlap region between the second metal wire and the second detection gate structure below, the first P-type active region, the first detection gate structure, the first contact hole, the first gate contact hole, the first metal wire, and the third metal wire form a first detection structure, the second P-type active region, the second detection gate structure, the second contact hole, the second gate contact hole, the second metal wire, and the fourth metal wire form a second detection structure, and the first detection structure and the second detection structure are arranged in parallel to form a detection structure; and S6: performing defect detection by using a scanning electron microscope, wherein a voltage contrast of the scanning electron microscope is adjusted, images corresponding to the first metal wire and the second metal wire are adjusted to a bright contrast, the detection structure is imaged to obtain voltage contrast images of the first metal layer in the first detection structure and the second detection structure, and if only the metal wire connected to the contact hole in the connection region of the gate structure in the first detection structure has a brighter contrast, it is determined that there is a physical short-circuit defect between the first metal layer in the first detection structure and a gate below.

Figure 2:
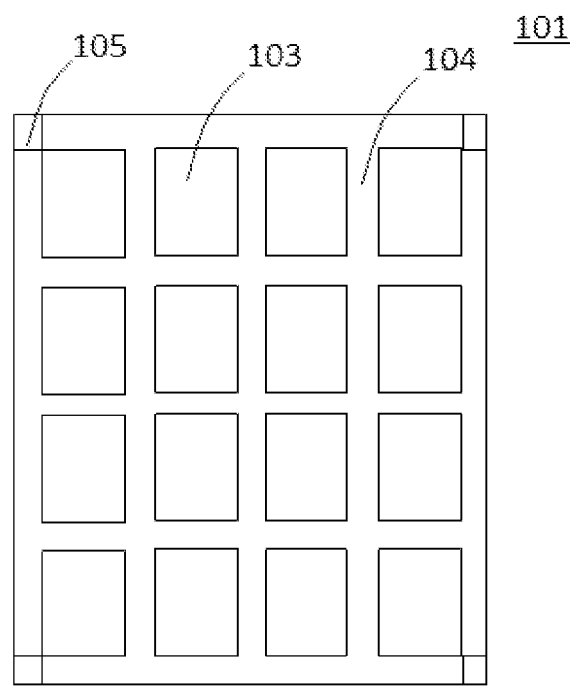
FIG. 2 is an enlarged schematic diagram of an exposure unit in FIG. 1.
Figure 3:
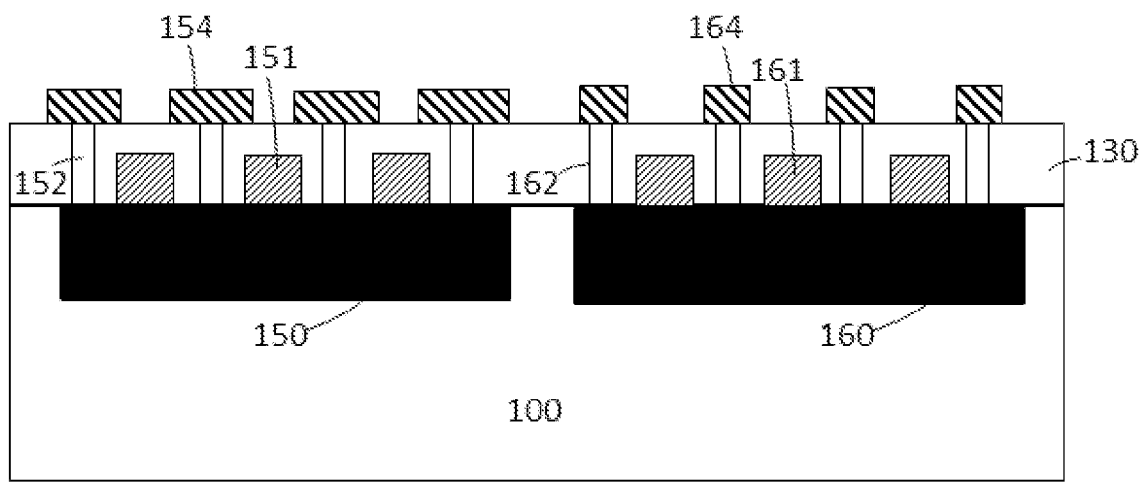
FIG. 3 is a structural schematic diagram of a semiconductor device on the wafer according to an embodiment.
Figure 4:
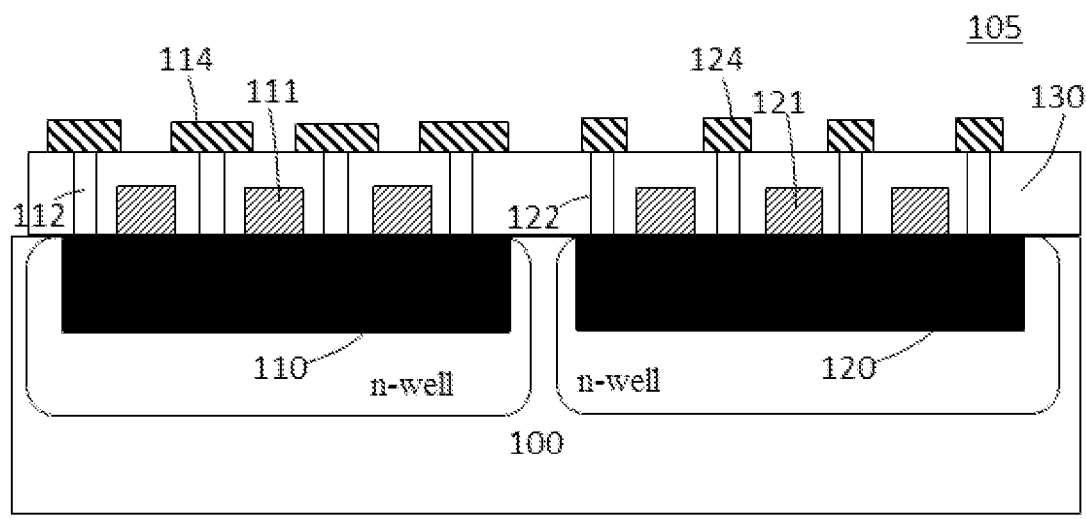
FIG. 4 is a structural schematic diagram of a detection device structure on the wafer according to an embodiment.
Figure 5:
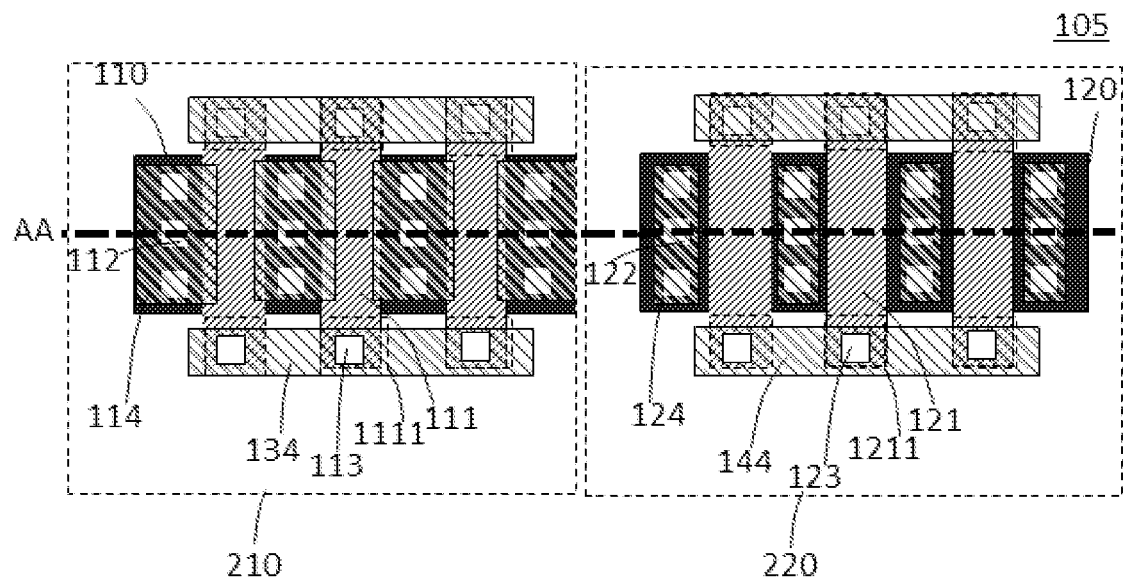
FIG. 5 is the planar schematic diagram of the detection device structure on the wafer according to an embodiment.

Specifically, referring to FIGS. 1-5, it can be seen that FIG. 1 is a schematic diagram of a wafer according to an embodiment. FIG. 2 is an enlarged schematic diagram of a lithography exposure unit in FIG. 1. FIG. 3 is a structural schematic diagram of a semiconductor device on the wafer according to an embodiment. FIG. 4 is a structural schematic diagram of a detection device structure on the wafer according to an embodiment. FIG. 5 is a planar schematic diagram of the detection device structure on the wafer according to an embodiment. FIG. 4 is a cross sectional diagram obtained by cutting the detection device structure along the dashed line AA in FIG. 5. The method for detecting a physical short-circuit defect between a first metal layer and a gate below includes the following steps.

Step S1: A wafer 100 is provided, wherein the wafer 100 includes a plurality of lithography exposure units 101, each exposure unit 101 includes a plurality of dies 103, the plurality of dies 103 is separated from each other by dicing channels 104, referring to FIG. 4, a first P-type active region 110 and a second P-type active region 120 are formed in a detection region or a dicing channel region 104 of the wafer 100, and the first P-type active region 110 and the second P-type active region 120 are arranged in parallel.

In an embodiment, the wafer 100 is a silicon substrate wafer. Referring to FIG. 1, the wafer 100 includes a plurality of lithography exposure units 101, referring to FIG. 2, each exposure unit 101 includes a plurality of dies 103, the die 103 is a formation region of a semiconductor device, a junction region between the dies 103 and the peripheral edge of the exposure unit 101 are dicing channel regions 104, and the dicing channel region 104 may be referred to as a scribe line.

In an embodiment, the first P-type active region 110 and the second P-type active region 120 are formed in an n-well.

Step S2: Referring to FIG. 4, a first detection gate structure 111 is formed in the first P-type active region 110, and a second detection gate structure 121 is formed in the second P-type active region 120, referring to FIG. 5, two ends of the first detection gate structure 111 extend to the outside of the first P-type active region 110, a portion of the first detection gate structure 111 that extends to the outside of the first P-type active region 110 forms a connection region 1111 of the first detection gate structure 111, two ends of the second detection gate structure 121 extend to the outside of the second P-type active region 120, and a portion of the second detection gate structure 121 that extends to the outside of the second P-type active region 120 forms a connection region 1211 of the second detection gate structure 121.

In an embodiment, the first detection gate structure 111 and the second detection gate structure 121 include a stacking structure of a gate dielectric layer and a metal gate.

In an embodiment, the connection region 1111 of the first detection gate structure 111 and the connection region 1211 of the second detection gate structure 121 are located in a silicon oxide region.

Referring to FIG. 4, in an embodiment, there is a plurality of first detection gate structures 111 arranged in parallel; and there is a plurality of second detection gate structures 121 arranged in parallel.

Step S3: An interlayer dielectric layer 130 is formed, and a planarization process is performed on the interlayer dielectric layer 130 (in FIG. 4, thickness of the interlayer dielectric layer 130 remains relatively thick after the planarization)

Step S4: Contact holes are formed in the interlayer dielectric layer 130, wherein the contact holes include a first contact hole 112 in the first P-type active region 110, a second contact hole 122 in the second P-type active region 120, a first gate contact hole 113 in the connection region 1111 of the first detection gate structure 111, and a second gate contact hole 123 in the connection region 1211 of the second detection gate structure 121, and a distance between the first contact hole 112 and the first detection gate structure 111 adjacent thereto is equal to a distance between the second contact hole 122 and the second detection gate structure 121 adjacent thereto.

Certainly, there may be a deviation from the above-mentioned "a distance between the first contact hole 112 and the first detection gate structure 111 adjacent thereto is equal to a distance between the second contact hole 122 and the second detection gate structure 121 adjacent". In an embodiment, the deviation from "is equal to" is approximately 20%; in some examples, the deviation is 10%; and in other examples, the deviation is 5%.

Step S5: A first metal layer is formed on the interlayer dielectric layer 130, the first metal layer including a first metal wire 114 connected to the first contact hole 112, a second metal wire 124 connected to the second contact hole 122, a third metal wire 134 connected to the first gate contact hole 113, and a fourth metal wire 144 connected to the second gate contact hole 123, and a planarization process is performed, wherein the first metal wire 114 and the first detection gate structure 111 below at least partially overlap, there is no projective overlap region between the second metal wire 124 and the second detection gate structure 121 below, the first P-type active region 110, the first detection gate structure 111, the first contact hole 112, the first gate contact hole 113, the first metal wire 114, and the third metal wire 134 form a first detection structure 210, the second P-type active region 120, the second detection gate structure 121, the second contact hole 122, the second gate contact hole 123, the second metal wire 124, and the fourth metal wire 144 form a second detection structure 220, and the first detection structure 210 and the second detection structure 220 are arranged in parallel to form a detection structure 105 (FIG. 5).

Step S6: Defect detection is performed by using a scanning electron microscope (SEM), wherein a voltage contrast of the scanning electron microscope is adjusted, images corresponding to the first metal wire 114 and the second metal wire 124 are adjusted to a bright contrast, the detection structure is imaged to obtain voltage contrast images of the first metal layer in the first detection structure and the second detection structure. If the metal wire (i.e., the third metal wire 134 connected to the first gate contact hole 113 in the connection region 1111 of the first detection gate structure 111) which is connected to the contact hole 112 in the connection region 1111 of the gate structure 111 in the first detection structure 210 turns up into a brighter image, it can be determined that there is a physical short-circuit defect between the first metal layer 114 in the first detection structure 210 and the detection gate 111 below it.

Specifically, the defect detection is performed by using the scanning electron microscope (SEM), the voltage contrast of the scanning electron microscope is adjusted, the images corresponding to the first metal wire 114 and the second metal wire 124 are adjusted to the bright contrast at a low voltage of 1 keV, the detection structures are imaged at the low voltage of 1 keV to obtain the voltage contrast images of the first metal layer 114 and 124 in the first detection structure 210 and the second detection structure 220.

According to the working principle of the scanning electron microscope, when electrons accelerated by the voltage of the scanning electron microscope are emitted to incident on the surface of a semiconductor sample (for example, the detection structure 105 including the first detection structure 210 and the second detection structure 220), secondary electrons are scattered from the sample surface, and a specific electric potential is generated. The magnitude of the potential depends on a secondary electron yield coefficient A, and A=number of secondary electrons/number of incident electrons. When A<1, the surface potential is negative; when A>1, the surface potential is positive. When the surface potential is positive, as a PN junction formed between the P-type active region and the n-well is positively biased and conductive, and the potential on the contact hole in the P-type active region is decreased, in this case, a large amount of electrons in the n-well are attracted to the sample surface and easily become secondary electrons which are scattered out, therefore a large amount of secondary electrons are collected by the detection device. Accordingly, voltage contrast images of the first metal wire 114 and the second metal wire 124 connected to the contact hole in the P-type active region in the scanning electron microscope are bright. Since the gate contact hole on the gate structure is isolated from the semiconductor substrate by the intermediate gate dielectric layer 130, only a small amount of secondary electrons on the surface of the gate contact hole are scattered out. Therefore, voltage contrast images of the third metal wire 134 and the fourth metal wire 144 connected to the gate contact hole in the connection region of the gate structure are dark in normal conditions.

Figure 6:
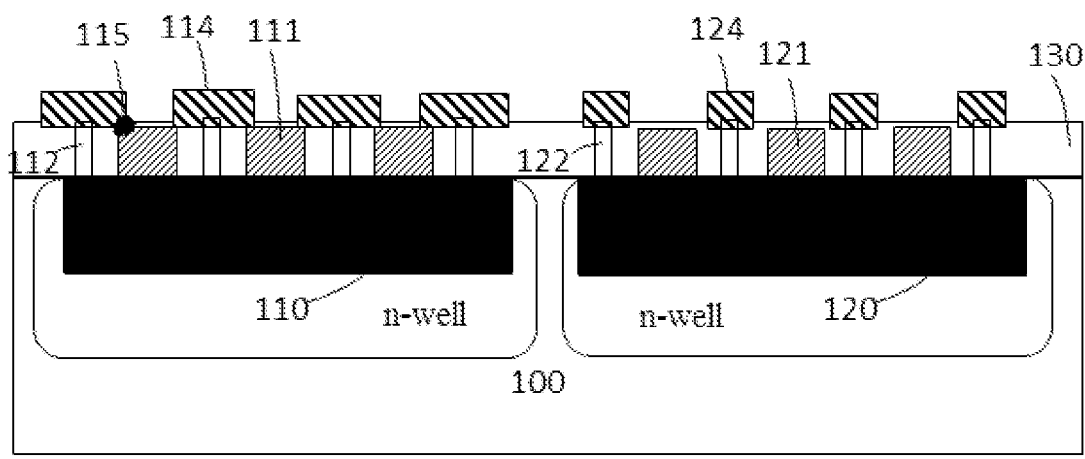
FIG. 6 is a schematic diagram of a physical short-circuit defect occurring between a first metal layer and a gate—below according to an embodiment.

In the present application, if the third metal wire 134 has a brighter contrast and the fourth metal wire 144 has a dark contrast, that is, only if the metal wire connected to the gate contact hole in the connection region 1111 of the detection gate structure 111 in the first detection structure 210 has a brighter contrast, it indicates that there is a short-circuit defect due to physical contact (ie, physical short-circuit defect) between the first metal layer 114 in the first detection structure 210 and the gate 112 below, but there is no short-circuit defect between the first metal layer 124 in the second detection structure 220 and the gate 122 below. A short-circuit due to physical contact does not occur between the second metal layer 124 in the second detection structure 220 and the gate 122 below structure because there is no projective overlap region therebetween. In addition, a short-circuit due to an excessively small distance does not occur between the gate structure and the contact hole in the second P-type active region. Since the distance between the first contact hole 112 and the first detection gate structure 111 adjacent thereto is equal to the distance between the second contact hole 122 and the second detection gate structure 121 adjacent thereto, a short-circuit due to an excessively small distance likewise does not occur between the gate structure in the first P-type active region and the contact hole in the first P-type active region. Accordingly, it can be determined that the case in which only the metal wire connected to the contact hole in the connection region of the gate structure in the first detection structure 210 has a brighter contrast is due to the physical short-circuit defect between the first metal layer in the first detection structure and the gate below, that is, it can be determined that there is a physical short-circuit defect between the first metal layer in the first detection structure and the gate below. Referring to FIG. 6, which is a schematic diagram of of the detection structure when there is a physical short-circuit defect occurring between a first metal layer and a gate below according to an embodiment. The possibility of either excessive thinning of the interlayer dielectric layer 130 or over-etching of the first metal layer which leads to the physical short-circuit defect 115 between the first metal layer and the gate below can be caught. For the same reason, in the second detection structure, it is also learned that there is no physical short-circuit defect between the first metal layer and the gate below.

If the third metal wire 134 and the fourth metal wire 144 both turn up to a brighter contrast, it can be determined that there are short-circuit defects due to occurrences of an excessive amount of small distances between the gate structures in the second detection structure and the contact hole in the second P-type active region. Since the distance between the first contact hole 112 and the first detection gate structure 111 adjacent thereto is equal to the distance between the second contact hole 122 and the second detection gate structure 121 adjacent thereto, a short-circuit from the excessive small distances also occurs between the gate structure in the first P-type active region and the contact hole in the first P-type active region, which produced the brighter contrast for both the third metal wire 134 and the fourth metal wire 144.

If the third metal wire 134 and the fourth metal wire 144 both have a dark contrast, it can be determined that there is no short-circuit defect due to an excessively small distance between the gate structure in the second detection structure and the contact hole in the second P-type active region, similarly, there is no short-circuit defect due to an excessively small distance between the gate structure in the first P-type active region and the contact hole in the first P-type active region, and there is no physical short-circuit defect between the first metal layer in the first detection structure and the gate below.

In an embodiment, in step S1, during a process of forming the first P-type active region 110 and the second P-type active region 120, referring to FIG. 3, a first active region (such as active regions 150 and 160 in FIG. 3) for forming a semiconductor device is formed in the die 103; in step S2, during a process of forming the first detection gate structure 111 and the second detection gate structure 121, a gate structure (such as gate structures 151 and 161 in FIG. 3) of the semiconductor device is formed in the first active region (such as the active regions 150 and 160 in FIG. 3); in step S4, the contact holes in the interlayer dielectric layer 130 further include a contact hole (such as contact holes 152 and 162 in FIG. 3) formed in the first active region (such as the active regions 150 and 160 in FIG. 3); and in step S5, the first metal layer further include a metal wire (such as metal wires 154 and 164 in FIG. 3) connected to the contact hole (such as the contact holes 152 and 162 in FIG. 3) in the first active region (such as the active regions 150 and 160 in FIG.

3), to form the semiconductor device in the die 103. In an embodiment, a gate structure (such as gate structures 151 and 161 in FIG. 3) includes a stacking structure of a gate dielectric layer and a metal gate. In an embodiment, the first P-type active region 110, the first detection gate structure 111, the first contact hole 112, the first gate contact hole 113, the first metal wire 114, and the third metal wire 134 of the first detection structure 210, as well as the second P-type active region 120, the second detection gate structure 121, the second contact hole 122, the second gate contact hole 123, the second metal wire 124, and the fourth metal wire 144 of the second detection structure 220, are formed by adding a corresponding pattern in a photomask of a corresponding structure of the semiconductor device in the die 103, with a simple process and a low cost.

In an embodiment, the detection structure 105 is arranged at a corner of the exposure unit 101. Referring to FIG. 2, the detection structure 105 is located at a corner of the exposure unit 101, so to facilitate detection of the situation on the edge of the wafer.

In an embodiment, the detection structure 105 is arranged in the exposure unit 101 on the edge of the wafer, so to facilitate detection of the situation on the edge of the wafer. Referring to FIG. 1, the detection structure 105 is arranged in the exposure unit 101 on the edge of the wafer. In some examples, the detection structure 105 is arranged in both the exposure unit 101 on the edge of the wafer and the exposure unit 101 near a central portion of the wafer, so as to detect the situations of both the edge of the wafer and the central portion of the wafer. As the edge of the wafer is more prone to defects, in some examples, the number of the exposure units 101 provided with the detection structure 105 on the edge of the wafer is greater than the number of the exposure units 101 provided with the detection structure 105 near the central portion of the wafer, to increase the detection intensity on edge of the wafer. Referring to FIG. 1, there are eight exposure units 101 provided with the detection structure 105 on the edge of the wafer and there is one exposure unit 101 provided with the detection structure 105 near the central portion of the wafer. Nine points are selected as detection points, including eight points on the edge and one point in the center, after voltage contrast adjustment, the first metal wire connected to the contact hole in the P-type active region is adjusted to a bright contrast at the low voltage of 1 keV, in which case the first metal layer connected to the contact hole on the gate has a dark contrast in normal conditions. The detection structure is imaged at the low voltage of 1 keV to obtain nine voltage contrast images of the first metal layer, so as to detect the case of a physical short-circuit defect between the first metal layer and the gate below on both the edge of the wafer and the central portion of the wafer and to increase the detection intensity on the edge of the wafer.

As described above, after the first metal layer is formed, a defect detection step using the scanning electron microscope is added to determine whether there is a physical short-circuit defect between the first metal layer and the gate below, thereby reducing the difficulty in looking for the cause and location of the defect and reducing the time for understanding the cause of the defect. In addition, the physical short-circuit defect between the first metal layer and the gate below can be found during a semiconductor product manufacturing process, instead of discovering the problem at the final yield test, thereby significantly reducing the time interval from the physical short-circuit defect occurrence to defect identification.

One embodiment of the present application further provides a device structure for detecting a physical short-circuit defect between a first metal layer and a gate below, referring to FIGS. 1-5, including: a first P-type active region 110 and a second P-type active region 120 in an n-well in a detection region or a dicing channel region 104 of a wafer, wherein the first P-type active region 110 and the second P-type active region 120 are arranged in parallel; a first detection gate structure 111 and a first contact hole 112 in the first P-type active region 110, wherein two ends of the first detection gate structure 111 extend to the outside of the first P-type active region 110, and a portion of the first detection gate structure 111 that extends to the outside of the first P-type active region 110 forms a connection region 1111 of the first detection gate structure 111; a second detection gate structure 121 and a second contact hole 122 in the second P-type active region 120, wherein two ends of the second detection gate structure 121 extend to the outside of the second P-type active region 120, and a portion of the second detection gate structure 121 that extends to the outside of the second P-type active region 120 forms a connection region 1211 of the second detection gate structure 121; a first gate contact hole 113 and a second gate contact hole 123, wherein the first gate contact hole 113 is located in the connection region 1111 of the first detection gate structure 111, and the second gate contact hole 123 is located in the connection region 1211 of the second detection gate structure 121; an interlayer dielectric layer 130 filling a region between the first detection gate structure 111, the second detection gate structure 121, the first contact hole 112, the second contact hole 122, the first gate contact hole 113, and the second gate contact hole 123; and a first metal wire 114, a second metal wire 124, a third metal wire 134, and a fourth metal wire 144 formed on the interlayer dielectric layer 130, wherein the first metal wire 114 is connected to the first contact hole 112, the second metal wire 124 is connected to the second contact hole 122, the third metal wire 134 is connected to the first gate contact hole 113, the fourth metal wire 144 is connected to the second gate contact hole 123, the first metal wire 114 and the first detection gate structure 111 at least partially overlap, there is no projective overlap region between the second metal wire 124 and the second detection gate structure 121 from a top view, and a distance between the first contact hole 112 and the first detection gate structure 111 adjacent thereto is equal to a distance between the second contact hole 122 and the second detection gate structure 121 adjacent thereto.

Likely, there may be a deviation from the above-mentioned "a distance between the first contact hole 112 and the first detection gate structure 111 adjacent thereto is equal to a distance between the second contact hole 122 and the second detection gate structure 121 adjacent". In some example, the deviation can be 20%; in some other examples, the deviation can be 10%; and in an other examples, the deviation can be 5%.

In an embodiment, the first detection gate structure 111 and the second detection gate structure 121 include a stacking structure of a gate dielectric layer and a metal gate.

In an embodiment, there are a plurality of first detection gate structures 111 arranged in parallel; and there are a plurality of second detection gate structures 121 arranged in parallel.

In an embodiment, the detection structure 105 is arranged at a corner of an exposure unit 101 in the wafer. Referring to FIG. 2, the detection structure 105 is arranged at the corner of the exposure unit 101 in the wafer, so as to facilitate detection of the situation on the edge of the wafer.

In an embodiment, the detection structure 105 is arranged in the exposure unit 101 on the edge of the wafer, so to facilitate detection of the situation on the edge of the wafer.

Referring to FIG. 1, the detection structure 105 is arranged in the exposure unit 101 on the edge of the wafer. In some examples, the detection structure 105 is arranged in both the exposure unit 101 on the edge of the wafer and the exposure unit 101 near a central portion of the wafer, so as to detect the situations of both the edge of the wafer and the central portion of the wafer. As the edge of the wafer is more prone to defects, in some examples, the number of the exposure units 101 provided with the detection structure 105 on the edge of the wafer is greater than the number of the exposure units 101 provided with the detection structure 105 near the central portion of the wafer, to increase the detection intensity on edge of the wafer.

The parallel arrangement is a parallel arrangement along the X-axis direction of the wafer 100 or a parallel arrangement along the Y-axis direction of the wafer 100 in FIG. 1.

As described above, a first detection structure and a second detection structure are arranged in parallel in a detection region or a dicing channel region of a wafer, each detection structure includes a P-type active detection, a detection gate structure and a contact hole in the P-type active detection, gate contact holes at two ends of the detection gate structure, a metal wire connected to the contact hole in the P-type active detection, and a metal wire connected to the gate contact hole, the detection gate structure of the first detection structure and the metal wire there-above at least partially overlap, and there is no projective overlap region between the detection gate structure of the second detection structure and the metal wire there-above. A short-circuit defect due to physical contact between a first metal layer and a gate below on the wafer can be detected and positioned, shortening the time for finding the detect; and the first detection structure and the second detection structure are formed synchronously during a formation process of a semiconductor device, with a simple process and a low cost.

Finally, it should be noted that the above embodiments are only used for describing the technical solutions of the present application, instead of limiting the technical solutions. Although the present application is described in detail with reference to the above embodiments, it should be understood by one skilled in the art that the technical solutions recorded in the above embodiments may still be modified, or some or all of the technical features may be replaced equivalently. These modifications or replacements do not make the essence of the corresponding technical solution deviate from the scope of the technical solutions of the embodiments of the present application.

What is claimed is:

1. A method for detecting a physical short-circuit defect between a first metal layer and a gate below, comprising steps of:
    S1: providing a wafer, wherein the wafer comprises a plurality of exposure units for lithography, wherein each of the plurality of exposure units comprises a plurality of dies, wherein the plurality of dies is separated from each other by dicing channels; and
        forming a first P-type active region and a second P-type active region in a detection region or a dicing channel region of the wafer, wherein the first P-type active region and the second P-type active region are arranged in parallel;
    S2: forming a first detection gate structure in the first P-type active region, and forming a second detection gate structure in the second P-type active region, wherein two ends of the first detection gate structure extend outside of the first P-type active region, wherein a portion of the first detection gate structure outside the first P-type active region forms a connection region of the first detection gate structure, wherein two ends of the second detection gate structure extend outside of the second P-type active region, wherein a portion of the second detection gate structure outside the second P-type active region forms a connection region of the second detection gate structure;
    S3: forming an interlayer dielectric layer, and performing a planarization process on a top surface of the interlayer dielectric layer;
    S4: forming contact holes in the interlayer dielectric layer, wherein the contact holes comprise a first contact hole in the first P-type active region, a second contact hole in the second P-type active region, a first gate contact hole in the connection region of the first detection gate structure, and a second gate contact hole in the connection region of the second detection gate structure, wherein a distance between the first contact hole and the first detection gate structure adjacent thereto is equal to a distance between the second contact hole and the second detection gate structure adjacent thereto;
    S5: forming a first metal layer on the interlayer dielectric layer, wherein the first metal layer comprises a first metal wire connected to the first contact hole, a second metal wire connected to the second contact hole, a third metal wire connected to the first gate contact hole, and a fourth metal wire connected to the second gate contact hole; and
    performing a planarization process, wherein the first metal wire and the first detection gate structure below at least partially overlap, wherein there is no projective overlap region between the second metal wire and the second detection gate structure from atop view below;
    wherein the first P-type active region, the first detection gate structure, the first contact hole, the first gate contact hole, the first metal wire, and the third metal wire form a first detection structure, wherein the second P-type active region, the second detection gate structure, the second contact hole, the second gate contact hole, the second metal wire, and the fourth metal wire form a second detection structure, and wherein the first detection structure and the second detection structure are arranged in parallel to form a detection structure; and
    S6: performing the physical short-circuit defect detection by using a scanning electron microscope, wherein adjusting a voltage contrast of the scanning electron microscope to have a bright contrast between an image of the first metal wire and an image of the second metal wire, wherein the detection structure is imaged to obtain voltage contrast images of the first metal layer in the first detection structure and the second detection structure, and determining a location of the physical short-circuit defect between the first metal layer in the first detection structure and the gate below by identifying if a brighter contrast shows at the metal wire connected to the contact hole in the connection region of the gate structure in the first detection structure.

2. The method for detecting the physical short-circuit defect between the first metal layer and the gate below according to claim 1, wherein during a process of forming the first P-type active region and the second P-type active region, the step S1 further comprises forming a first active region in the plurality of dies of a semiconductor device;
    wherein the step S2 further comprises forming a gate structure of the semiconductor device in the first active region during forming the first detection gate structure and the second detection gate structure;

wherein the step S4 further comprises forming another contact hole in the first active region in the interlayer dielectric layer; and wherein in step S5, the first metal layer comprises another metal wire connected to the contact hole in the first active region, to form the semiconductor device in one of the plurality of dies.

3. The method for detecting the physical short-circuit defect between the first metal layer and the gate below according to claim 1, wherein the first detection gate structure comprises a stacking structure of a first gate dielectric layer and a first metal gate and the second detection gate structure comprises a stacking structure of a second gate dielectric layer and a second metal gate.

4. The method for detecting the physical short-circuit defect between the first metal layer and the gate below according to claim 1, wherein a plurality of the first detection gate structures is arranged in parallel; and a plurality of the second detection gate structures is arranged in parallel.

5. The method for detecting the physical short-circuit defect between the first metal layer and the gate below according to claim 1, wherein the first P-type active region and the second P-type active region are formed in an n-well.

6. The method for detecting the physical short-circuit defect between the first metal layer and the gate below according to claim 1, wherein the detection structure is arranged at a corner of one of the plurality of exposure units.

7. The method for detecting the physical short-circuit defect between the first metal layer and the gate below according to claim 1, wherein the detection structure is arranged in one of the plurality of exposure units on an edge of the wafer.

8. The method for detecting the physical short-circuit defect between the first metal layer and the gate below according to claim 7, wherein the detection structure is arranged in both one of the plurality of exposure units on the edge of the wafer and one of the plurality of exposure units near a central portion of the wafer.

9. The method for detecting the physical short-circuit defect between the first metal layer and the gate below according to claim 8, wherein a number of the plurality of exposure units provided with the detection structures on the edge of the wafer is greater than the number of the exposure units provided with the detection structures near the central portion of the wafer.

10. A structure for detecting a physical short-circuit defect between a first metal layer and a gate below, comprising:
a first P-type active region and a second P-type active region in an n-well in a detection region or a dicing channel region of a wafer, wherein the first P-type active region and the second P-type active region are arranged in parallel;
a first detection gate structure and a first contact hole in the first P-type active region, wherein two ends of the first detection gate structure extend to outside the first P-type active region, wherein a portion of the first detection gate structure outside the first P-type active region forms a connection region of the first detection gate structure;
a second detection gate structure and a second contact hole in the second P-type active region, wherein two ends of the second detection gate structure extend to outside the second P-type active region, wherein a portion of the second detection gate structure outside the second P-type active region forms a connection region of the second detection gate structure;
a first gate contact hole and a second gate contact hole, wherein the first gate contact hole is located in the connection region of the first detection gate structure, and wherein the second gate contact hole is located in the connection region of the second detection gate structure;
an interlayer dielectric layer filling gaps in regions among the first detection gate structure, the second detection gate structure, the first contact hole, the second contact hole, the first gate contact hole, and the second gate contact hole; and
a first metal wire, a second metal wire, a third metal wire, and a fourth metal wire formed on the interlayer dielectric layer, wherein the first metal wire is connected to the first contact hole, the second metal wire is connected to the second contact hole, the third metal wire is connected to the first gate contact hole, the fourth metal wire is connected to the second gate contact hole; wherein the first metal wire and the first detection gate structure at least partially overlap, wherein there is no projective overlap region between the second metal wire and the second detection gate structure from a top view; and wherein a distance between the first contact hole and the first detection gate structure adjacent thereto is equal to a distance between the second contact hole and the second detection gate structure adjacent thereto.

11. The structure for detecting the physical short-circuit defect between the first metal layer and the gate below according to claim 10, wherein the first detection gate structure comprises a stacking structure of a first gate dielectric layer and a first metal gate and the second detection gate structure comprises a stacking structure of a second gate dielectric layer and a second metal gate.

12. The structure for detecting the physical short-circuit defect between the first metal layer and the gate below according to claim 10, wherein the detection structure is arranged at a corner of one of the plurality of exposure units in the wafer.

13. The structure for detecting the physical short-circuit defect between the first metal layer and the gate below according to claim 10, wherein the detection structure is arranged in one of the plurality of exposure units at the edge of the wafer.

14. The structure for detecting the physical short-circuit defect between the first metal layer and the gate below according to claim 13, wherein the detection structure is arranged in both one of the plurality of exposure units at the edge of the wafer and one of the plurality of exposure units near a central portion of the wafer.

15. The structure for detecting the physical short-circuit defect between the first metal layer and the gate below according to claim 14, wherein a number of the plurality of exposure units provided with the detection structure on the edge of the wafer is greater than a number of the plurality of exposure units provided with the detection structure near the central portion of the wafer.

* * * * *